(12) United States Patent
Yuan et al.

(10) Patent No.: US 7,928,780 B1
(45) Date of Patent: Apr. 19, 2011

(54) PHASE-LOCKED-LOOP CIRCUIT

(75) Inventors: Xiaoming Yuan, Wuhan (CN); Zhuohui Tan, Shanghai (CN); Robert William Delmerico, Clifton Park, NY (US); Haiqing Weng, Shanghai (CN); Robert Allen Seymour, Roanoke, VA (US)

(73) Assignee: General Electric Company, Niskayuna, NY (US)

( * ) Notice: Subject to any disclaimer, the term of this patent is extended or adjusted under 35 U.S.C. 154(b) by 30 days.

(21) Appl. No.: 12/569,119

(22) Filed: Sep. 29, 2009

(51) Int. Cl.
*H03B 21/00* (2006.01)
*H03L 7/06* (2006.01)
(52) U.S. Cl. ......... 327/156; 327/159; 327/105; 327/107
(58) Field of Classification Search .................. None
See application file for complete search history.

(56) References Cited

U.S. PATENT DOCUMENTS

| 7,106,564 | B2 * | 9/2006 | Deng et al. ............... 361/62 |
| 7,492,617 | B2 | 2/2009 | Petter et al. |
| 2003/0165036 | A1 | 9/2003 | Tuladhar |
| 2007/0005194 | A1 | 1/2007 | Chang et al. |
| 2008/0224649 | A1 * | 9/2008 | Bae et al. ............... 318/801 |
| 2010/0134058 | A1 * | 6/2010 | Nagashima et al. ..... 318/400.23 |
| 2010/0213925 | A1 * | 8/2010 | Teodorescu et al. ....... 324/76.78 |

OTHER PUBLICATIONS

Zhuohui Tan et al., "Power Conversion Control System," U.S. Appl. No. 12/569,160, filed Sep. 29, 2009.

* cited by examiner

*Primary Examiner* — Tuan Lam
(74) *Attorney, Agent, or Firm* — Ann M. Agosti

(57) ABSTRACT

A phase-locked loop circuit comprises a phase error detector for receiving a multi-phase reference signal and a synchronized phase signal of the phase-locked-loop circuit, and for performing a rotational transformation to convert the multi-phase reference signal into two-phase quantities at a synchronous rotation d-q reference frame. A monotonic transfer module receives the two-phase quantities, and generates a monotonic phase error signal which is monotonic when a phase difference between the multi-phase reference signal and the synchronized phase signal ranges from −180 degrees to 180 degrees. A regulator receives the monotonic phase error signal, and generates a synchronized rotation frequency. An integrator receives the synchronized rotation frequency, and generates the synchronized phase signal.

13 Claims, 6 Drawing Sheets

PHASE-LOCKED-LOOP CIRCUIT

BACKGROUND

The invention relates generally to phase-locked loop (PLL) circuits for generating synchronized phase and frequency signals from multi-phase reference signals.

A phase locked loop (PLL) circuit is a closed loop circuit that generates a synchronized output signal from a reference signal. The PLL circuit automatically responds to the frequency and phase of the reference signal by adjusting the output signal until the output signal is matched to the reference signal in both frequency and phase. In a power control system, for example, the PLL circuit detects the phase information of the grid voltage, so that a power controller can synchronize a converter's output voltage with the grid voltage. During a transient event such as a short circuit fault in power system, the phase angle and magnitude of the reference signal may change significantly, and it is desirable for the PLL circuit to provide a quick response.

BRIEF DESCRIPTION

In accordance with an embodiment disclosed herein, a phase-locked loop circuit comprises a phase error detector for receiving a multi-phase reference signal and a synchronized phase signal of the phase-locked-loop circuit, and for performing a rotational transformation to convert the multi-phase reference signal into two-phase quantities at a synchronous rotation d-q reference frame. A monotonic transfer module receives the two-phase quantities, and generates a monotonic phase error signal which is monotonic when a phase difference between the multi-phase reference signal and the synchronized phase signal ranges from −180 degrees to 180 degrees. A regulator receives the monotonic phase error signal, and generates a synchronized rotation frequency. An integrator receives the synchronized rotation frequency, and generates the synchronized phase signal.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the invention relate to a phase-locked-loop (PLL) circuit for generating synchronized phase and frequency signals from a multi-phase reference signal. The PLL circuit comprises a phase detector for receiving the multi-phase reference signal and a feedback synchronized phase signal and generating two-phase signals in a two-phase direct and quadrature (d-q) reference frame. The PLL circuit comprises a monotonic transfer function for receiving the two-phase signals in the d-q reference frame and for generating a phase error signal. The phase error signal is monotonic for a phase difference between the reference signal and the synchronized phase signal over the range from −180 degrees to 180 degrees.

Figure 1:
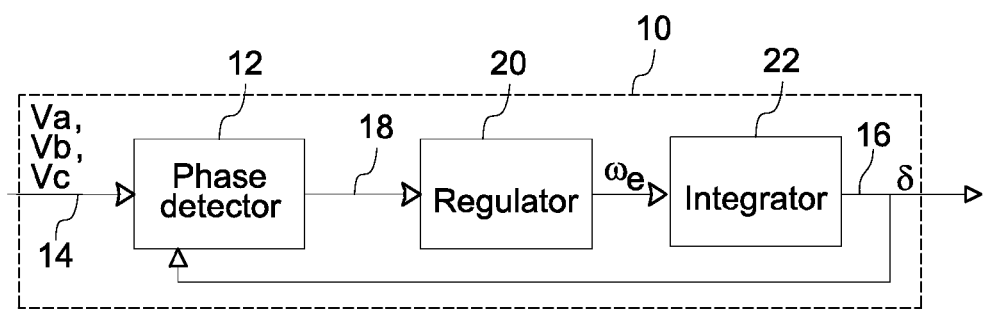
FIG. 1 is a block diagram of a conventional phase-locked-loop (PLL) circuit.

To better understand the invention, reference is first made to a conventional PLL circuit 10 through FIGS. 1-4. As illustrated in FIG. 1, the illustrated PLL circuit 10 comprises a phase detector 12 for receiving a multi-phase reference signal 14 and a synchronized output signal 16 of PLL circuit 10 and for using these signals to generate a phase error signal 18. A regulator 20 determines a synchronized frequency ($\omega_e$) based on the phase error signal 18. An integrator 22 generates a synchronized phase signal ($\delta$), and thus an output signal of the PLL circuit may include synchronized frequency ($\omega_e$) and phase ($\delta$) signals.

When reference signal 14 is a balanced three-phase sinusoidal reference signal with voltage phasors ($V_a$, $V_b$, and $V_c$), it can be expressed as equation 1 below:

$$\begin{bmatrix} V_a \\ V_b \\ V_c \end{bmatrix} = V_m \begin{bmatrix} \sin\omega t \\ \sin(\omega t - 2\pi/3) \\ \sin(\omega t + 2\pi/3) \end{bmatrix}, \quad \text{equation 1}$$

wherein "$V_m$" is a voltage amplitude of positive sequence, and "$\omega$" is a fundamental rotational frequency of the three-phase reference signal 14.

Figure 2:
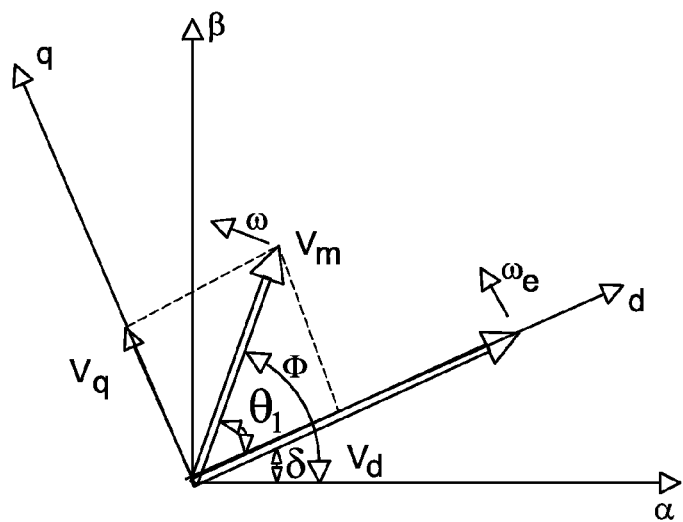
FIG. 2 illustrates a rotational transformation of a phase detector of the PLL circuit of FIG. 1, wherein a phase error is less than 90 degrees.

Referring to FIG. 2, generation of phase error signal 18 by phase detector 12 typically comprises a rotational transformation. Phase detector 12 may transform the three-phase reference signal ($V_a$, $V_b$, and $V_c$) into two-phase quantities ($V_\alpha$, $V_\beta$) in a two-phase stationary α-β reference frame according to equation 2 below for example:

$$\begin{bmatrix} V_\alpha \\ V_\beta \end{bmatrix} = \frac{2}{3} \times \begin{bmatrix} 1 & -0.5 & -0.5 \\ 0 & -\frac{\sqrt{3}}{2} & \frac{\sqrt{3}}{2} \end{bmatrix} \begin{bmatrix} V_a \\ V_b \\ V_c \end{bmatrix} = \begin{bmatrix} V_m \times \cos\Phi \\ V_m \times \sin\Phi \end{bmatrix}, \quad \text{equation 2}$$

$$\Phi = \omega \times t + \Phi_0.$$

wherein "$\Phi$" is an instantaneous phase angle of the reference signal 14 and $\Phi_0$ is an initial phase angle of the reference phase signal 14. Then, the two-phase quantities ($V_\alpha$, $V_\beta$) may be transformed into two-phase quantities ($V_d$, $V_q$) in a synchronous rotating d-q reference frame according to equation 3:

$$\begin{bmatrix} V_d \\ V_q \end{bmatrix} = \begin{bmatrix} \cos\delta & \sin\delta \\ -\sin\delta & \cos\delta \end{bmatrix} \begin{bmatrix} V_\alpha \\ V_\beta \end{bmatrix}, \delta = \omega_e \times t + \delta_0 \quad \text{equation 3}$$

wherein "$\delta$" is an instantaneous synchronized phase angle, and "$\omega_e$" is a synchronized rotation speed, and thus:

$$V_d = V_\alpha \times \cos\delta + V_\beta \times \sin\delta = V_m \times \cos\Phi \cos\delta + V_m \times \sin\Phi$$
$$\sin\delta = V_m \times \cos(\Phi - \delta) = V_m \times \cos\theta \quad \text{equation 4}$$

$V_q = V_\alpha \times (-\sin \delta) + V_\beta \times \cos \delta = V_m \times \cos \Phi (-\sin \delta) + V_m \times \sin \Phi \cos \delta = V_m \times \sin(\Phi - \delta) = V_m \times \sin \theta$  equation 5 wherein "θ" is a phase error of the phase (Φ) of reference voltage signal ($V_a, V_b, V_c$) 14 and the synchronized phase (δ), i.e. θ=Φ−δ. The phase error signal 18 from phase detector 12 is typically the value of $V_q$. If $V_q$=0, that is a phase lock status, and no adjustment is needed. If $V_q \neq 0$, there is a margin of adjustment, and PLL circuit 10 will provide adjusted synchronized output signal for adjustment of phase, frequency, or both phase and frequency.

Figure 3:
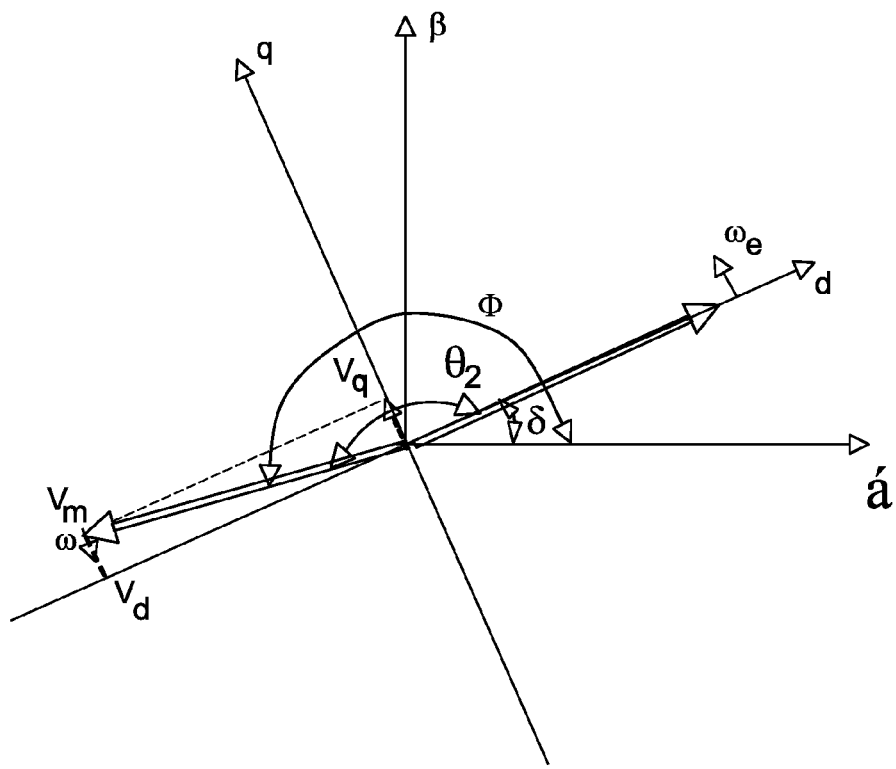
FIG. 3 illustrates a rotational transformation of the phase detector of the PLL circuit of FIG. 1, wherein a phase error is greater than 90 degrees.
Figure 4:
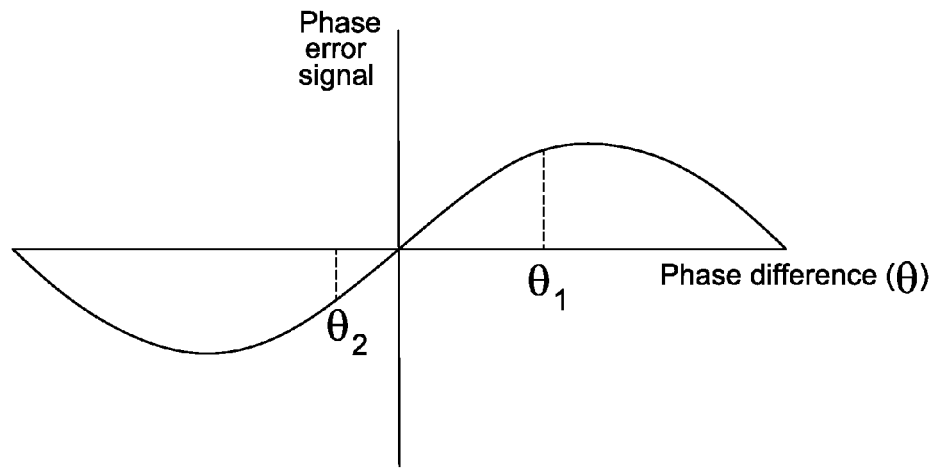
FIG. 4 illustrates a sine-wave characteristic of the phase error detector of the PLL circuit of FIG. 1.

As is shown in FIG. 2, $V_q$=V×sin θ, and the phase error signal 18 of the phase detector 12 has a sine-wave characteristic. Referring to FIGS. 2 and 4, while the phase difference ($\theta_1$) remains within a range of −90 degrees to 90 degrees, the phase error signal 18 is monotonic with respect to the phase displacement ($\theta_1$), and PLL circuit 10 is capable of performing smooth acquisition and adjustment. Referring to FIGS. 3 and 4, however, when the phase difference ($\theta_2$) is within −180 degrees to −90 degrees or within 90 degrees to 180 degrees, the phase error signal 18 decreases while phase difference ($\theta_2$) increases. Under a transient condition such as a grid voltage event with phase jump, with or without changes in frequency, the phase difference (θ) may jump to the range of 180 degrees to −90 degrees or 90 degrees to 180 degrees, and, particularly when the corresponding phase error signal 18 is small, the convergence of the PLL circuit 10 is undesirably slowed down.

Figure 5:
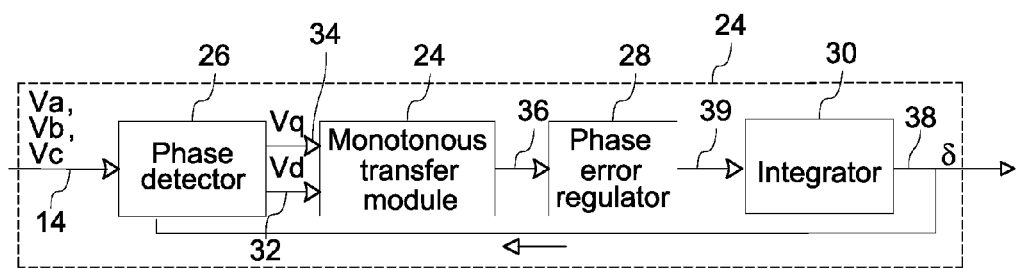
FIG. 5 is a block diagram of an exemplary PLL circuit according to one embodiment of the invention.

Referring to FIG. 5, a PLL circuit 24 according to one embodiment of the invention comprises a phase detector 26, a monotonic transfer module 27, a phase-error regulator 28, and an integrator 30. Phase detector 26 receives a multi-phase reference signal 14 which, in one embodiment, is a three-phase voltage signal ($V_a, V_b, V_c$) for example. Phase detector 26 further receives a synchronized output signal 38 of PLL circuit 24 and uses both signals to generate two-phase signals ($V_d, V_q$) 32, 34 in a synchronous two-phase d-q reference frame. In certain embodiments of the invention, generation of the two-phase voltage signals ($V_d, V_q$) 32, 34 in the d-q reference frame is accomplished in a similar manner as described with respect to the transformation performed by the phase detector 12 of FIG. 1. A phase difference (θ) between the three phase reference signal ($V_a, V_b, V_c$) and the synchronized output signal 38 of PLL circuit 24 can be obtained according to equation 6 below:

$\theta = a \tan 2(V_q, V_d)$.  equation 6

In certain embodiments of the invention, monotonic transfer module 27 is configured to receive the two-phase signal ($V_d, V_q$) 32, 34 and to generate a monotonic phase error signal 36 which monotonically increases with respect to the phase difference (θ) when ranging from −180 degrees to 180 degrees. In certain embodiments of the invention, the monotonic transfer module 27 comprises a monotonic transfer function (f($V_d, V_q$)) to generate the monotonic phase error signal 36 with the two-phase quantities $V_d$ and $V_q$ as inputs. In one embodiment, the monotonic transfer function (f($V_d, V_q$)) comprises an arctangent function according to equation 7 below:

Phase error signal=$k_1 \times a \tan 2(V_q, V_d)$  equation 7 wherein $k_1$ is a coefficient. In one embodiment, $k_1$ comprises 2, for example. Thus, the phase error signal 36 linearly increases when the phase difference (λ) ranges from −180 degrees to 180 degrees.

Figure 6:
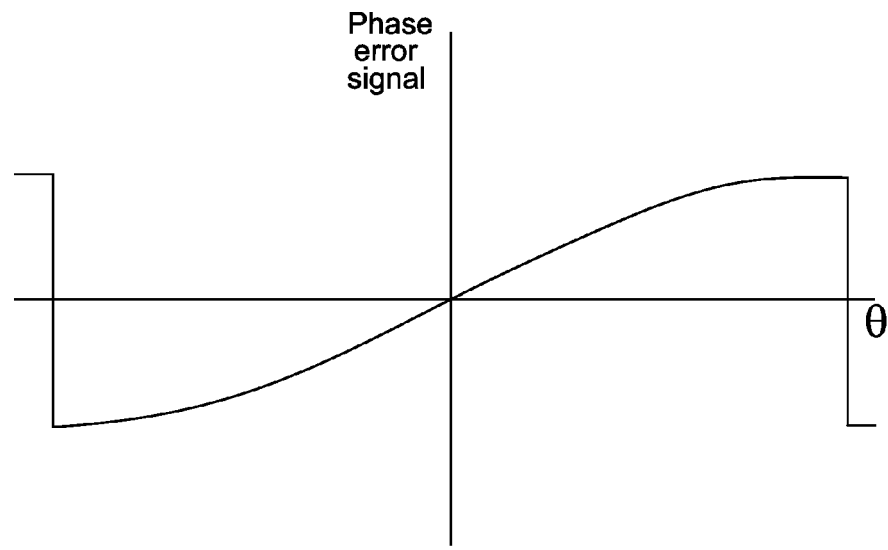
FIGS. 6 and 7 illustrate monotonic characteristics of a monotonic transfer module according different embodiments of the invention.

In accordance with another embodiment, the monotonic transfer function (f($V_d, V_q$)) of the monotonic transfer module 27 is performed as a sine function of one half of the phase difference according to equation 8 below:

Phase error signal =  equation 8

$$k_2 \times \sin\left(\frac{\theta}{2}\right) = k_2 \times sgn(V_q) \sqrt{\frac{1 - \frac{V_d}{\sqrt{V_d^2 + V_q^2}}}{2}}$$

wherein $k_2$ is a coefficient. In one embodiment $k_2$ comprises 2, for example. Phase error signal 36 monotonically increases with the phase difference (θ) when the phase difference (θ) ranges from −180 degrees to 180 degrees as is illustrated in FIG. 6.

In accordance with still another embodiment, the monotonic transfer function (f($V_d, V_q$)) is a signum function according to equation 9 below:

$$\text{phase error signal} = k_2 \times sgn(V_q) \frac{1 - \frac{V_d^2 sgn(V_d)}{V_d^2 + V_q^2}}{2}.$$  equation 9

Figure 7:
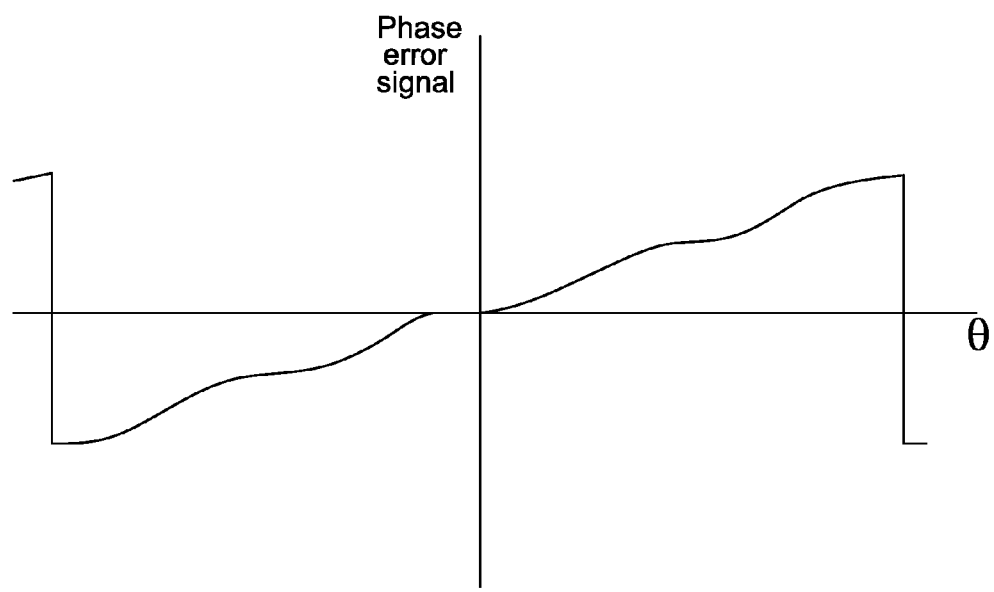

The monotonic phase error signal 36 generated according to equation 8 is illustrated in FIG. 7. Equation 9 is similar to equation 8 but does not include a square root computation, and thus can be computed more quickly.

Figure 8:
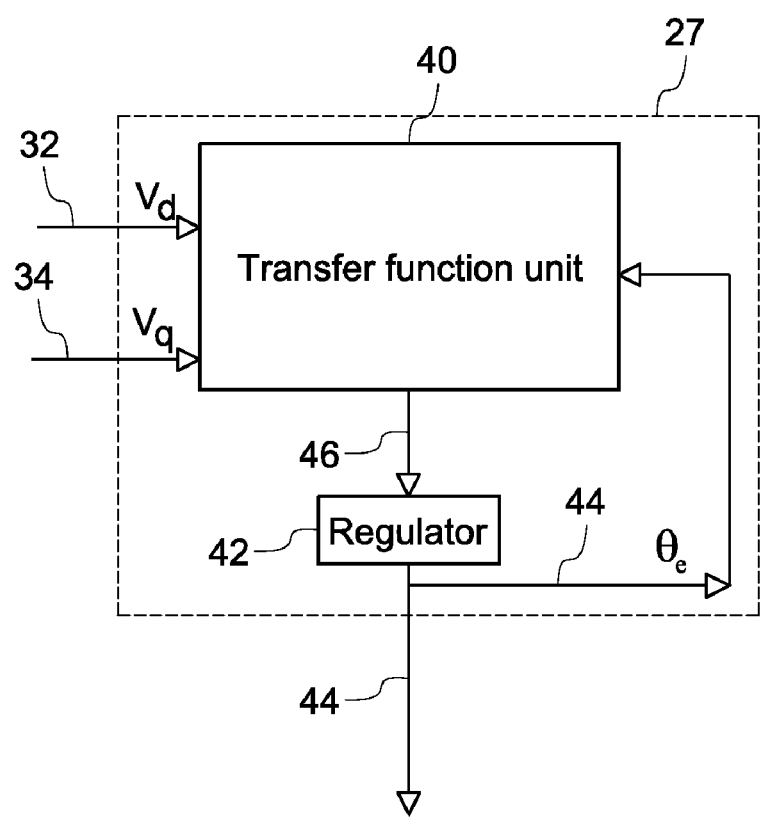
FIGS. 8-10 are block diagrams of monotonic transfer modules according to other embodiments of the invention.

In still anther embodiment, with reference to FIG. 8, the monotonic transfer module 27 comprises an error-tracking loop with the two-phase quantities ($V_d, V_q$) 32, 34 as inputs to generate a monotonic phase error signal 46 which is close to the actual phase difference (θ). In the illustrated embodiment, the error-tracking loop comprises a transfer function unit 40 and a regulator 42. The transfer function unit 40 is configured to receive the two-phase quantities ($V_d, V_q$) 32, 34 and an estimated phase difference ($\theta_e$) 44, and generate an error signal 46 which is an indication of the difference of the actual phase difference (θ) and the estimated phase difference ($\theta_e$) 44 according to equation 10 below for example:

error signal=$k_4 \times \sin(\theta - \theta_e)$.  equation 10 wherein $k_4$ is a coefficient, and in one embodiment, $k_4$>1. The error signal 46 is transmitted to the regulator 42 to generate the estimated phase difference ($\theta_e$) 44. If error signal=0, θ=$\theta_e$, the estimated phase difference ($\theta_e$) 44 is the same as the actual phase difference (θ). If error signal≠0, the estimated phase difference ($\theta_e$) 44 is not the same as the actual phase difference (θ), and the regulator 42 generates a new phase difference signal ($\theta_e$) until the error signal=0. This new phase difference signal is monotonic beyond the range of −180 degrees to 180 degrees. In certain embodiments, the error-tracking loop comprises a fast closed loop. Accordingly, the monotonic phase error signal 36 is the estimated phase difference ($\theta_e$) from the error-tracking loop of the monotonic transfer module 27 which remains in alignment with the actual phase difference (θ). In one embodiment, a ratio of a response time $t_1$ of the PLL circuit and a response time $t_2$ of the error-tracking loop is at least 10.

Figure 9:
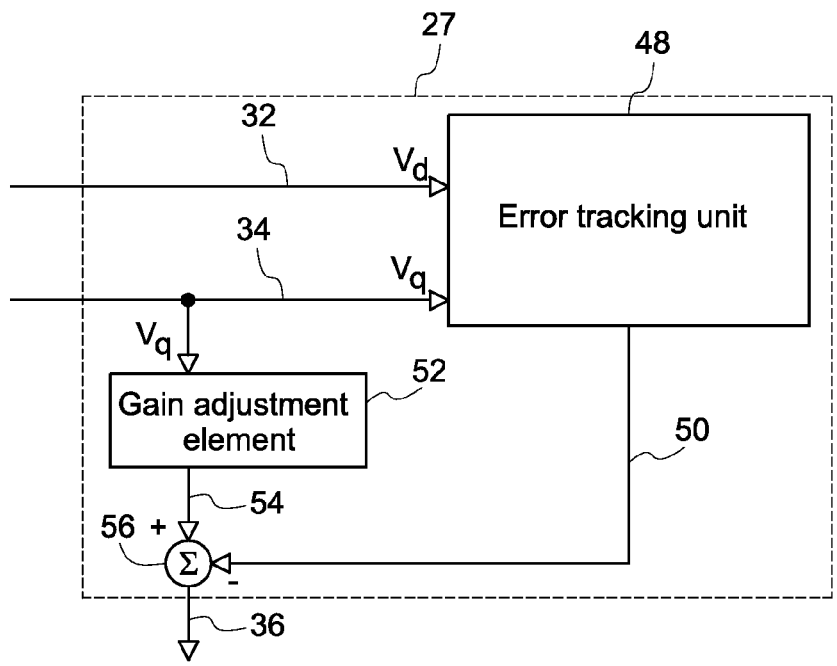
Figure 10:
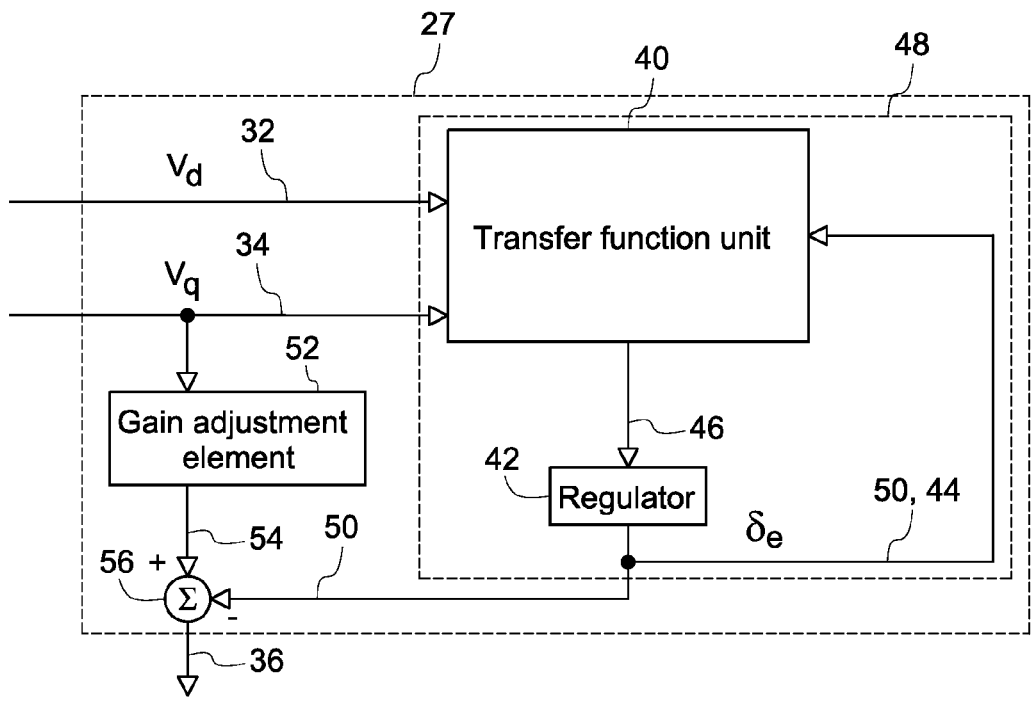

In the embodiments of FIGS. 9 and 10, the monotonic transfer module 27 comprises an error-tracking unit 48 configured to receive the two-phase quantities ($V_d, V_q$) 32, 34 and to generate an error signal 50 which is substantially equal to the phase difference (θ), a gain adjustment element 52 for receiving the quantity ($V_q$) 34 and for generating an error signal 54 which is substantially equal to the value of sin(θ), and a summing junction 56 for receiving the error signals 50, 54 and generating monotonic phase error signal 36 according to equation 11 below:

$$\text{phase error signal} = \sin\theta + \theta. \quad \text{equation 11}$$

In one embodiment, according to equation 5, $V_q = V_m \times \sin\theta$, and error signal 50 is obtained by adjusting the quantity ($V_q$) by gain adjustment element 52 according to:

$$\text{error signal} = k_4 \times V_m \times \sin\theta = \sin\theta$$

wherein $k_4 = 1/V_m$.

In the embodiment of FIG. 9, error-tracking unit 48 performs an arctangent function such as in equation 6 above. In one specific embodiment, error-tracking unit 48 performs an arctangent function such as equation 12 below:

$$\text{error signal} = a\tan 2((V_q \times N), V_d), \quad \text{equation 12}$$

wherein "N" is a coefficient. In one embodiment, N>1. A larger value for the coefficient (N) will increase the response to phase jumps. In one embodiment, "N" comprises 100.

The embodiment of FIG. 10 is similar to that of the embodiment of FIG. 9 and illustrates that the error-tracking unit 48 may comprise an error-tracking loop such as described above with reference to FIG. 8.

In other embodiments of the invention, the monotonic transfer module 27 may comprise any other possible circuit or device capable of receiving two-phase voltage signals ($V_d$, $V_q$) 32, 34 and generating a phase error signal 36 which monotonically increases with the phase difference ($\lambda$) ranging from at least −180 degrees to 180 degrees. One such example is a look-up table.

Referring back to FIG. 5, the monotonic phase error signal 36 from the monotonic transfer module 27 is sent to phase-error regulator 28. In one embodiment of the invention, the phase error regulator 28 comprises a PI controller for receiving the monotonic phase error signal 36 as an input to generate a regulation signal 39 which is the synchronized frequency ($\omega_e$) of the grid voltage.

In the illustrated embodiment of FIG. 5, integrator 30 is configured to receive the synchronized rotation frequency ($\omega_e$) 39 from phase-error regulator 28 and to generate the synchronized phase angle signal ($\delta$) by a time integration as equation 13, for example:

$$\delta = \int \omega_e \cdot dt \quad \text{equation 13}$$

As the phase error signal is in a monotonic relationship when the phase difference ($\lambda$) ranges from −180 degrees to 180 degrees, the PLL circuit 24 provides a faster response than conventional PLL circuits when the phase difference is in the range of −180 degrees to −90 degrees or 90 degrees to 180 degrees.

As compared with the conventional PLL circuit 10 as described with reference to FIGS. 1-4, phase error signals of the embodiment of FIG. 5 are monotonic when the phase difference ($\theta$) between the reference signal 14 and the synchronized phase signal ($\delta$) ranges from −180 degrees to 180 degrees. Accordingly, PLL circuits 24 of the invention provide faster convergences for large phase jumps.

Unless defined otherwise, technical and scientific terms used herein have the same meaning as is commonly understood by one of skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items, and terms such as "front", "back", "bottom", and/or "top", unless otherwise noted, are merely used for convenience of description, and are not limited to any one position or spatial orientation.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

Furthermore, the skilled artisan will recognize the interchangeability of various features from different embodiments. The various features described, as well as other known equivalents for each feature, can be mixed and matched by one of ordinary skill in this art to construct additional systems and techniques in accordance with principles of this disclosure.

The invention claimed is:

1. A phase-locked loop circuit comprising:
    a phase error detector for receiving a multi-phase reference signal and a synchronized phase signal of the phase-locked-loop circuit, and for performing a rotational transformation to convert the multi-phase reference signal into two-phase quantities at a synchronous rotation d-q reference frame;
    a monotonic transfer module for receiving the two-phase quantities, and for generating a monotonic phase error signal which is monotonic when a phase difference between the multi-phase reference signal and the synchronized phase signal ranges from −180 degrees to 180 degrees; and
    a regulator for receiving the monotonic phase error signal, and for generating a synchronized rotation frequency; and
    an integrator for receiving the synchronized rotation frequency, and for generating the synchronized phase signal.

2. The phase-locked loop circuit of claim 1, wherein the monotonic transfer module is configured to perform an arctangent function of the two-phase quantities.

3. The phase-locked loop circuit of claim 1, wherein the monotonic transfer module is configured to perform a sine function of one half of the phase difference according to the two-phase quantities.

4. The phase-locked loop circuit of claim 1, wherein the monotonic transfer module is configured to perform a variation of a sine function of one half of the phase difference according to the following equation:

$$\text{phase error signal} = k \times sgn(V_q) \frac{1 - \frac{V_d^2 sgn(V_d)}{V_d^2 + V_q^2}}{2}$$

wherein k is a coefficient, and $V_d$ and $V_q$ are respectively the two-phase quantities of the synchronous rotation d-q reference frame.

5. The phase-locked loop circuit of claim 1, wherein the monotonic transfer module is configured to generate the monotonic phase error signal by searching in a look-up table.

6. The phase-locked loop circuit of claim 1, wherein the monotonic transfer module comprises an error-tracking loop for receiving the two-phase quantities and for generating an estimated phase difference.

7. The phase-locked loop circuit of claim 6, wherein the error-tracking loop comprises a transfer function unit for receiving the two-phase quantities and the estimated phase difference and for generating an error signal from a difference of the estimated phase difference and an actual phase difference, and a regulator for generating the estimated phase difference.

8. The phase-locked loop circuit of claim 7, wherein a ratio of a response time of the phase-locked loop circuit to a response time of the error-tracking loop is at least 10.

9. The phase-locked loop circuit of claim 7, wherein the transfer function unit is configured to perform a sine function of the difference of the estimated phase difference and the actual phase difference to generate the error signal.

10. The phase-locked loop circuit of claim 1, wherein the monotonic transfer module comprises an error-tracking unit for receiving the two-phase quantities and for generating an error signal which is substantially equal to the phase difference, a gain adjustment element for adjusting the two-phase quantity in a q axis of the synchronous rotation d-q reference frame to get an error signal, and a summing junction for receiving the error signal from the error-tracking unit and gain adjustment element to generate the monotonic phase error signal.

11. The phase-locked loop circuit of claim 10, wherein the error-tracking unit is configured to perform an arctangent function of the two-phase quantities to generate the error signal.

12. The phase-locked loop circuit of claim 11, wherein the error-tracking unit is configured to perform the arctangent function in accordance with:

a tan $2((V_q \times N), V_d)$, wherein "N" is constant coefficient, and N>1.

13. The phase-locked loop circuit of claim 10, wherein the error-tracking unit comprises an error-tracking loop for receiving the two-phase quantities and for generating an estimated phase difference substantially equal to an actual phase difference.

* * * * *